(12) United States Patent
Lee

(10) Patent No.: US 9,595,561 B2
(45) Date of Patent: Mar. 14, 2017

(54) SEMICONDUCTOR MEMORY DEVICES

(71) Applicant: Kilho Lee, Hwaseong-si (KR)

(72) Inventor: Kilho Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 9 days.

(21) Appl. No.: 13/951,328

(22) Filed: Jul. 25, 2013

(65) Prior Publication Data
US 2014/0042508 A1    Feb. 13, 2014

(30) Foreign Application Priority Data

Aug. 13, 2012  (KR) ........................ 10-2012-0088602

(51) Int. Cl.
    *H01L 27/22*    (2006.01)
    *H01L 29/78*    (2006.01)
    *H01L 27/115*   (2006.01)

(52) U.S. Cl.
    CPC ...... *H01L 27/228* (2013.01); *H01L 27/11585* (2013.01); *H01L 29/78* (2013.01)

(58) Field of Classification Search
    CPC ............. H01L 27/228; H01L 27/10888; H01L 27/10894; H01L 29/78
    USPC .................... 259/295, E29.27, E21.66; 438/3
    See application file for complete search history.

(56) References Cited

U.S. PATENT DOCUMENTS

| 5,291,435 | A  | 3/1994  | Yu |
| 6,426,896 | B1 | 7/2002  | Chen |
| 6,503,785 | B2 | 1/2003  | Chen |
| 6,958,503 | B2 | 10/2005 | Motoyoshi |
| 7,095,650 | B2 | 8/2006  | Motoyoshi |
| 7,166,888 | B2 | 1/2007  | Bhattacharyya |
| 7,205,164 | B1* | 4/2007 | Geha et al. ........................ 438/3 |
| 7,211,511 | B2 | 5/2007  | Horikoshi |
| 7,239,541 | B2 | 7/2007  | Saito et al. |
| 7,286,395 | B2 | 10/2007 | Chen et al. |
| 7,368,781 | B2 | 5/2008  | Lee |
| 7,593,253 | B2 | 9/2009  | Takemura et al. |

(Continued)

FOREIGN PATENT DOCUMENTS

| JP | 2006059869 A | 3/2006 |
| JP | 2011171430 A | 9/2011 |

(Continued)

OTHER PUBLICATIONS http://dictionary.reference.com/browse/between, 2015.*

*Primary Examiner* — Yu Chen
*Assistant Examiner* — Nilufa Rahim
(74) *Attorney, Agent, or Firm* — Renaissance IP Law Group LLP

(57) ABSTRACT

A semiconductor memory device includes a cell gate dielectric layer and a cell gate electrode disposed in a gate recess region crossing a cell active portion of a substrate, first and second doped regions disposed in the cell active portion at both sides of the gate recess region, respectively, at least one interlayer insulating layer covering the substrate, a data storage element electrically connected to the second doped region through a contact plug penetrating the at least one interlayer insulating layer, a mold layer covering the data storage element, and a bit line disposed in a cell groove formed in the mold layer. The bit line is in direct contact with a top surface of the data storage element.

7 Claims, 17 Drawing Sheets

(56) References Cited

U.S. PATENT DOCUMENTS

| | | |
|---|---|---|
| 7,919,377 B2 | 4/2011 | Lee |
| 2002/0008277 A1 | 1/2002 | Chen |
| 2004/0135184 A1 | 7/2004 | Motoyoshi |
| 2004/0180531 A1 | 9/2004 | Horikoshi |
| 2005/0128802 A1 | 6/2005 | Motoyoshi |
| 2005/0139935 A1 | 6/2005 | Lee |
| 2006/0163644 A1 | 7/2006 | Bhattacharyya |
| 2006/0171198 A1 | 8/2006 | Saito et al. |
| 2006/0220084 A1* | 10/2006 | Umehara et al. ............. 257/296 |
| 2007/0097730 A1 | 5/2007 | Chen et al. |
| 2007/0285974 A1 | 12/2007 | Takemura et al. |
| 2008/0160711 A1 | 7/2008 | Lee |
| 2011/0049657 A1 | 3/2011 | Tsukamoto et al. |
| 2011/0122674 A1 | 5/2011 | Lin et al. |
| 2011/0198715 A1* | 8/2011 | Matsuoka et al. ............. 257/421 |
| 2011/0233695 A1* | 9/2011 | Li et al. ........................ 257/421 |
| 2012/0146121 A1* | 6/2012 | Kim .............................. 257/315 |
| 2012/0211830 A1* | 8/2012 | Yoo ............................... 257/334 |
| 2012/0286227 A1* | 11/2012 | Chung .............................. 257/4 |
| 2013/0153982 A1* | 6/2013 | Lin ............................... 257/324 |
| 2013/0272059 A1* | 10/2013 | Lin et al. ...................... 365/158 |

FOREIGN PATENT DOCUMENTS

| | | |
|---|---|---|
| KR | 20050077157 A | 8/2005 |
| KR | 101043384 B1 | 6/2011 |

* cited by examiner

SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2012-0088602, filed on Aug. 13, 2012, the entirety of which is incorporated by reference herein.

BACKGROUND

The inventive concept relates to semiconductor devices and, more particularly, to semiconductor memory devices.

Semiconductor devices are widely used in an electronic industry because of small size, multi-function, and/or low manufacture costs thereof. The semiconductor devices may be categorized as any semiconductor memory device storing logical data, semiconductor logic devices processing operations of logical data, and system on chips having both the function of the semiconductor memory devices and the function of the semiconductor logic devices. Semiconductor devices have been increasingly integrated with the development of the electronic industry. However, various problems have arisen. For example, a margin of a manufacturing process may be reduced, at the cost of increased resistance of a memory cell in the semiconductor memory device. Thus, studies have been conducted to find solutions to the various problems.

SUMMARY

Embodiments of the inventive concept may provide highly integrated semiconductor memory devices.

Embodiments of the inventive concept may also provide semiconductor memory devices having excellent reliability.

In one aspect, a semiconductor memory device may include: a cell active portion defined in a semiconductor substrate; a cell gate dielectric layer and a cell gate electrode disposed in a gate recess region crossing the cell active portion; a first doped region and a second doped region within the cell active portion at both sides of the gate recess region, respectively; at least one interlayer insulating layer covering the semiconductor substrate; a contact plug penetrating the at least one interlayer insulating layer and connected to the second doped region; a data storage element disposed on the at least one interlayer insulating layer and electrically connected to the second doped region through the contact plug; a mold layer covering the data storage element; and a bit line disposed in a cell groove formed in the mold layer, the bit line directly contacting a top surface of the data storage element.

In an embodiment, the bit line may cross over the cell gate electrode; and the width of a bottom surface of the bit line may be smaller than the width of the top surface of the data storage element.

In an embodiment, the bottom surface of the bit line may be in contact with a center portion of the top surface of the data storage element, and the center portion of the top surface of the data storage element may be recessed to be lower than the edge portion of the top surface of the data storage element.

In an embodiment, the bottom surface of the bit line may include a first portion contacting the top surface of the data storage element and a second portion not contacting the top surface of the data storage element; and the second portion of the bottom surface of the bit line may be lower than the center portion of the top surface of the data storage element.

In an embodiment, the data storage element may include: a magnetic tunnel junction pattern including a reference magnetic pattern, a free magnetic pattern, and a tunnel barrier disposed between the reference and free magnetic patterns; and a capping pattern disposed on a top surface of the magnetic tunnel junction pattern and having a sidewall aligned with a sidewall of the magnetic tunnel junction pattern. In this case, the top surface of the data storage element may be a top surface of the capping pattern; and the recessed center portion of the top surface of the data storage element may be higher than a bottom surface of the capping pattern.

In an embodiment, the capping pattern may include a metal compound pattern and a metal pattern which are sequentially stacked. The metal compound pattern may include at least one of a metal nitride and a metal oxide. The recessed center portion of the top surface of the data storage element may be higher than a bottom surface of the metal pattern.

In an embodiment, a width of a top surface of the bit line may be greater than the width of the bottom surface of the bit line; and a sidewall of the bit line may be inclined.

In an embodiment, the at least one interlayer insulating layer may include sequentially stacked first interlayer insulating layer and second interlayer insulating layer. In this case, the semiconductor memory device may further include: a source line disposed in the first interlayer insulating layer and connected to the first doped region. The second interlayer insulating layer may cover the top surface of the source line.

In an embodiment, the semiconductor substrate includes a cell region and a peripheral region. The cell active portion, the data storage element, and the bit line may be disposed in the cell region. In this case, the semiconductor memory device may further include: a peripheral transistor formed at a peripheral active portion defined at the semiconductor substrate of the peripheral region, the peripheral transistor including a peripheral source/drain region; a peripheral plug penetrating the first interlayer insulating layer and connected to the peripheral source/drain region; and a peripheral wire connected to the peripheral plug. A top surface of the peripheral plug may be substantially coplanar with the top surface of the source line; a top surface of the peripheral wire may be substantially coplanar with a top surface of the bit line; and a bottom surface of the peripheral wire may be lower than a bottom surface of the bit line.

In an embodiment, the mold layer may include a first mold layer, an etch stop layer, and a second mold layer which are sequentially stacked. In this case, the semiconductor memory device may further include: a planarizing insulating layer disposed between the etch stop layer and the second mold layer in the peripheral region. The peripheral wire may be disposed in a peripheral groove successively penetrating the second mold layer, the planarizing insulating layer, the etch stop layer, the first mold layer, and the second interlayer insulating layer in the peripheral region.

In an embodiment, the peripheral transistor may further include a peripheral gate dielectric layer and a peripheral gate electrode which are sequentially stacked on the peripheral active portion; and the peripheral source/drain region may be disposed in the peripheral active portion at the side of the peripheral gate electrode.

In an embodiment, the at least one interlayer insulating layer may further include a capping interlayer insulating layer disposed between the first and second interlayer insulating layers; and the capping interlayer insulating layer may be formed of an insulating material to block metal atoms in the source line from being diffused into the second interlayer insulating layer.

In an embodiment, the semiconductor memory device may further include: a protecting insulating layer conformally formed on a surface of the data storage element. The mold layer may be disposed on the protecting insulating layer; and the cell groove may extend downward to penetrate the protecting insulating layer disposed on the top surface of the data storage element.

In an embodiment, the semiconductor memory device may further include: device isolation patterns formed in the semiconductor substrate to define an active line pattern; isolation gate electrodes disposed in isolation recess regions crossing the active line pattern and the device isolation patterns, respectively; and an isolation gate dielectric layer disposed between each of the isolation gate electrodes and an inner surface of each of the isolation recess regions. In this case, the cell active portion may correspond to a portion of the active line pattern which is disposed between the isolation gate electrodes adjacent to each other.

In an embodiment, an isolation voltage may be applied to each of the isolation gate electrodes when the semiconductor memory device is operated; and the isolation voltage may block a channel from being generated in the active line pattern under each of the isolation gate electrodes.

BRIEF DESCRIPTION OF THE DRAWINGS

The inventive concept will become more apparent with the attached drawings and accompanying detailed description.

DETAILED DESCRIPTION OF THE EMBODIMENTS

Figure 1A:
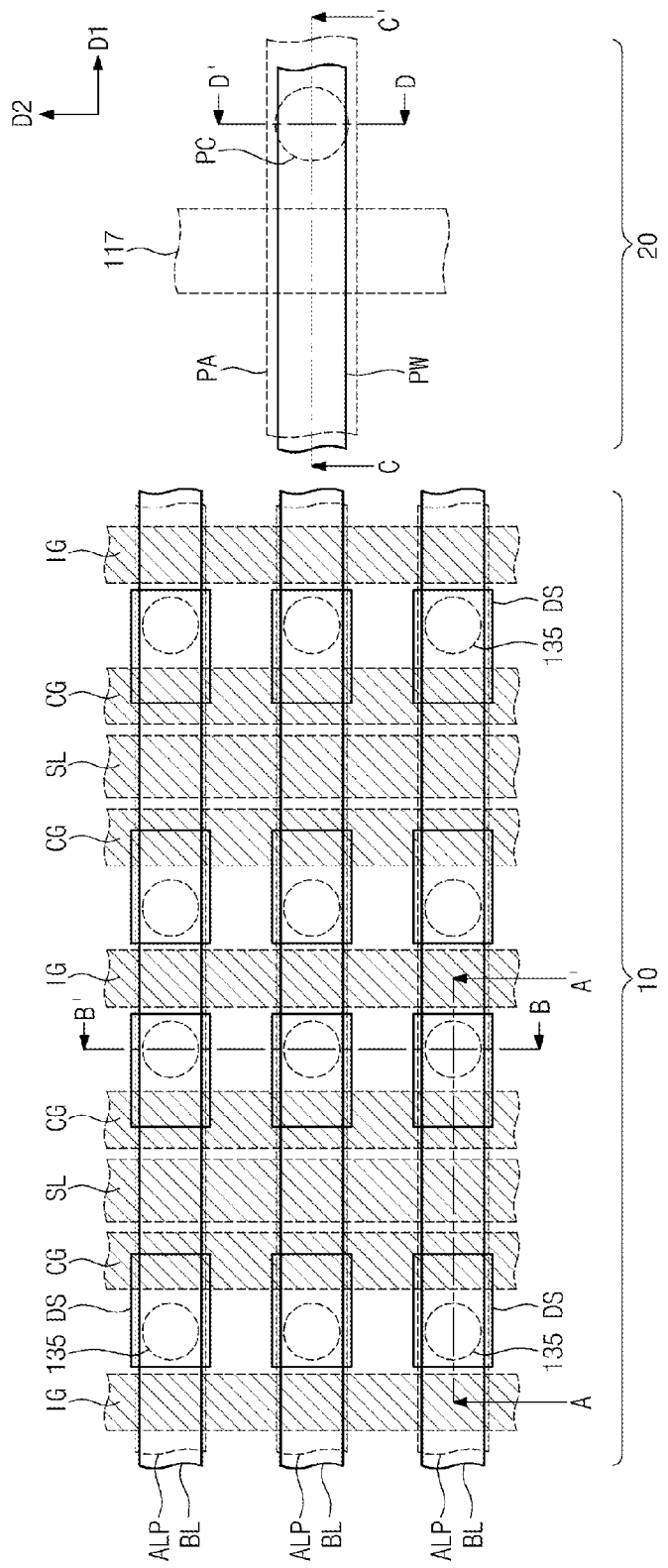
FIG. 1A is a plan view illustrating a semiconductor memory device according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
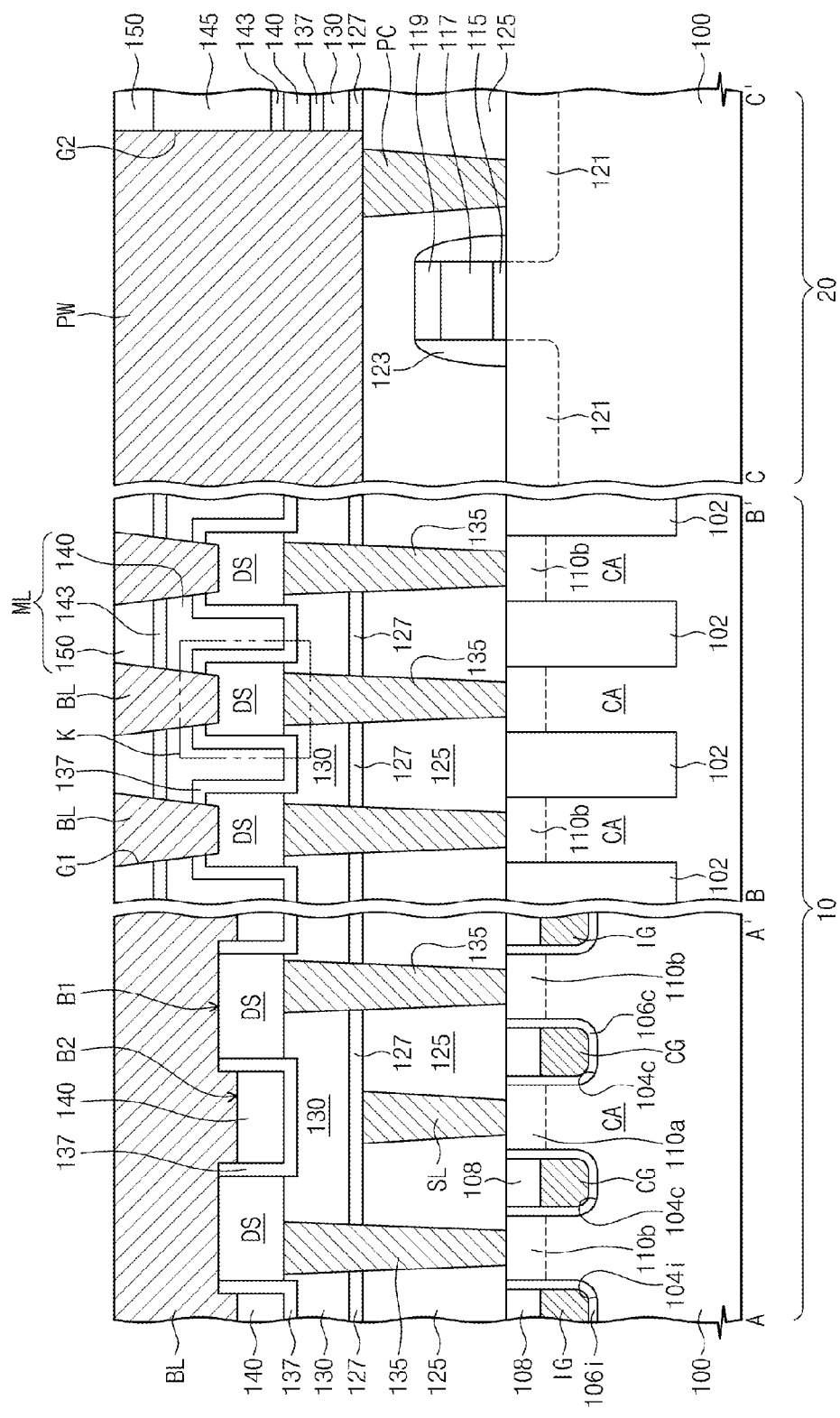
FIG. 1B is a cross-sectional view taken along lines A-A', B-B', and C-C' of FIG. 1A.
Figure 1C:
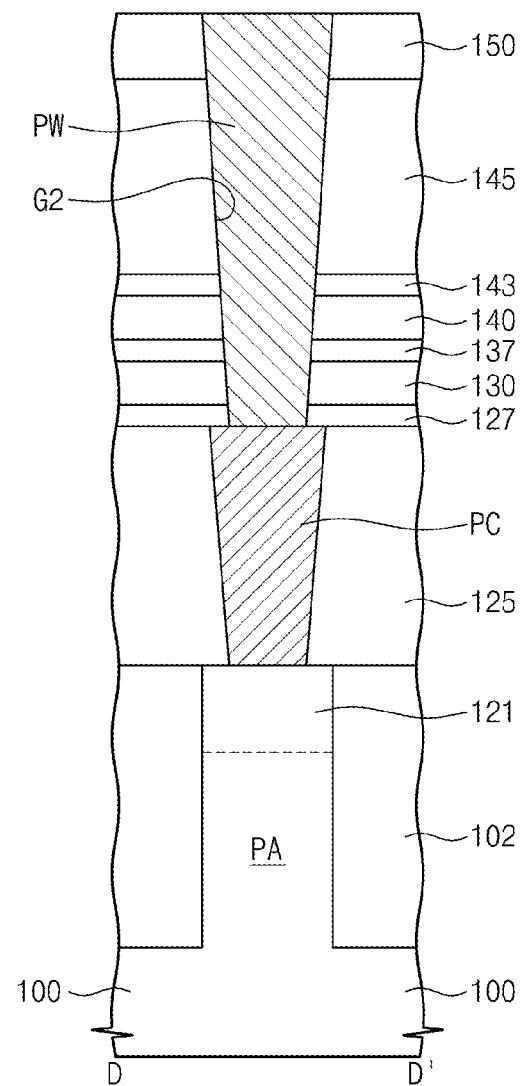
FIG. 1C is a cross-sectional view taken along a line D-D' of FIG. 1A.
Figure 2A:
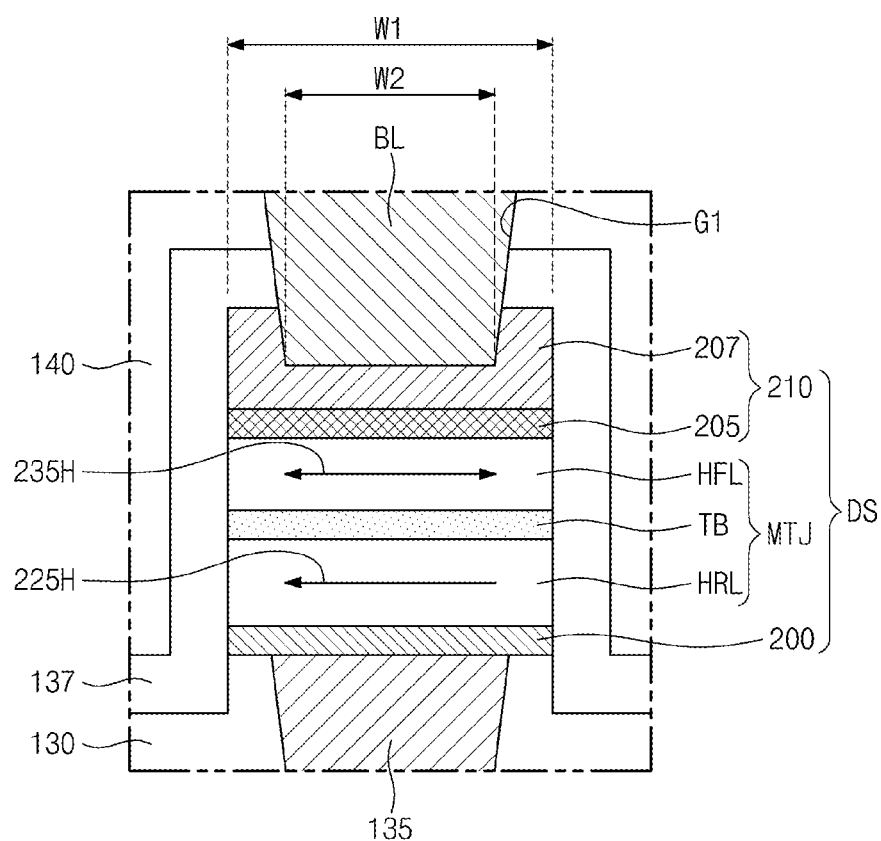
FIG. 2A is an enlarged view of a portion 'K' of FIG. 1B to explain a data storage element and a bit line in a semiconductor memory device according to exemplary embodiments of the inventive concept.

FIG. 1A is a plan view illustrating a semiconductor memory device according to exemplary embodiments of the inventive concept, FIG. 1B is a cross-sectional view taken along lines A-A', B-B', and C-C' of FIG. 1A, and FIG. 1C is a cross-sectional view taken along a line D-D' of FIG. 1A. FIG. 2A is an enlarged view of a portion 'K' of FIG. 1B to explain a data storage element and a bit line in a semiconductor memory device according to exemplary embodiments of the inventive concept.

Referring to FIGS. 1A to 1C, a semiconductor substrate 100 may include a cell region 10 and a peripheral region 20. The cell region 10 may include memory cells, and the peripheral region 20 may include peripheral circuits. The semiconductor substrate 100 may be, for example, a silicon substrate, a germanium substrate, or a silicon-germanium substrate.

Device isolation patterns 102 may be formed in the semiconductor substrate 100. The device isolation patterns 102 in the cell region 10 may define active line patterns ALP in the cell region 10. Each of the active line patterns ALP may be defined between a pair of the device isolation patterns 102 adjacent to each other. As illustrated in FIG. 1A, the device isolation patterns 102 and the active line patterns ALP in the cell region 10 may extend in parallel along a first direction D1 in a plan view. The device isolation patterns 102 and the active line patterns ALP in the cell region 10 may be alternately arranged in a second direction D2 perpendicular to the first direction when viewed from a plan view. The active line patterns ALP may be doped with dopants of a first conductivity type.

The device isolation pattern 102 in the peripheral region 20 may define a peripheral active portion PA. The peripheral active portion PA may be doped with dopants of the first conductivity type or a second conductivity type different from the first conductivity type.

Isolation recess regions 104i may cross the active line patterns ALP and the device isolation patterns 102 in the cell region 10. The isolation recess regions 104i may be defined by a U-shaped groove extending in parallel along the second direction D2 in plan view. The isolation recess regions 104i may divide each of the active line patterns ALP into a plurality of cell active portions CA. Each of the cell active portions CA may be a portion of the active line pattern ALP disposed between a pair of the isolation recess regions 104i adjacent to each other. In other words, each of the cell active portions CA may be defined between a pair of the device isolation patterns 102 adjacent to each other and between a pair of the isolation recess regions 104i adjacent to each other. In plan view, the cell active portions CA may be arranged along rows and columns. The cell active portions CA divided from each of the active line patterns ALP may be arranged in the first direction D1 to constitute each of the rows. The cell active portions CA disposed between the pair of isolation recess regions 104i adjacent to each other may be arranged in the second direction D2 to constitute each of the columns.

At least one gate recess region 104c may cross the cell active portions CA constituting each of the columns. The gate recess region 104c may have a groove extending in parallel to the isolation recess regions 104i. In some embodiments, a pair of gate recess regions 104c may cross the cell active portions CA constituting each of the columns. In this case, a pair of cell transistors may be formed in each of the cell active portions CA.

A depth of the gate recess region 104c may be substantially equal to a depth of the isolation recess region 104i. A width of the gate recess region 104c may be substantially equal to or different from a width of the isolation recess region 104i. The depth of each of the gate and isolation recess regions 104c and 104i may be smaller than a depth of a bottom surface of the device isolation pattern 102 in the cell region 10.

A cell gate electrode CG may be disposed in each of the gate recess region 104c, and a cell gate dielectric layer 106c may be disposed between the cell gate electrode CG and an inner surface of the gate recess region 104c. Due to the shape of the gate recess region 104c, the cell gate electrode CG may have a line-shape extending in the second direction D2. The cell transistor including the cell gate electrode CG may include a recessed channel region due to the gate recess region 104c.

An isolation gate electrode IG may be disposed in each of the isolation recess region 104i, and an isolation gate dielectric layer 106i may be disposed between the isolation gate electrode IG and an inner surface of the isolation recess region 104i. The isolation gate electrode IG may also have a line-shape extending in the second direction D2.

A gate hard mask pattern 108 may be disposed on each of the cell and isolation gate electrodes CG and IG. Top surfaces of the cell and isolation gate electrodes CG and IG may be lower than top ends of the cell and isolation recess regions 104c and 104i. Thus, the gate hard mask patterns 108 may be disposed in the cell and isolation recess regions 104c and 104i, respectively. Top surfaces of the gate hard mask patterns 108 may be substantially coplanar with a top surface of the semiconductor substrate 100.

When the semiconductor memory device is in operation, an isolation voltage may be applied to the isolation gate electrodes IG. A channel may not be generated in the active line pattern ALP under the inner surface of each of the isolation recess regions 104i by the isolation voltage. In other words, an isolation channel region under each of the isolation gate electrodes IG may be turned-off by the isolation voltage. Thus, the cell active portions CA divided from each of the active line patterns ALP may be electrically isolated from each other. For example, if the active line pattern ALP is doped with P-type dopants, the isolation voltage may be a ground voltage or a negative voltage.

For example, the cell gate electrode CG may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide). In an embodiment, the isolation gate electrode IG may be formed of the same material as the cell gate electrode CG. The cell gate dielectric layer 106c and the isolation gate dielectric layer 106i may include an oxide (e.g., silicon oxide), a nitride (e.g., silicon nitride), an oxynitride (e.g., silicon oxynitride), and/or a high-k dielectric (e.g., an insulating metal oxide such as hafnium oxide and/or aluminum oxide). The gate hard mask pattern 108 may include an oxide (e.g., silicon oxide), a nitride (e.g., silicon nitride), and/or an oxynitride (e.g., silicon oxynitride).

A first doped region 110a may be disposed in each of the cell active portions CA at a side of each of the cell gate electrodes CG, and a second doped region 110b may be disposed in each of the cell active portions CA at another side of each of the cell gate electrodes CG. In an embodiment, the first doped region 110a may be disposed in each of the cell active portions CA between the pair of cell gate electrodes CG crossing each of the cell active portions CA, and a pair of the second doped regions 110b may be disposed in both edge regions of each of the cell active portions CA, respectively. The pair of cell gate electrodes CG may be disposed between the pair of second doped regions 110b. Thus, the pair of cell transistors formed at each of the cell active portions CA may share the first doped region 110a. The first and second doped regions 110a and 110b may correspond to source/drain regions of the cell transistor. The first and second doped regions 110a and 110b may be doped with dopants of the second conductivity type different from the first conductivity type of the cell active portion CA. One of the first conductivity type dopant and the second conductivity type dopant may be a N-type dopant, the other of the first conductivity type dopant and the second conductivity type dopant may be a P-type dopant.

A peripheral gate dielectric layer 115, a peripheral gate electrode 117, and a peripheral gate hard mask pattern 119 may be sequentially stacked on the peripheral active portion PA in the peripheral region 20. Peripheral source/drain regions 121 may be disposed in the peripheral active portion PA at both sides of the peripheral gate electrode 117, respectively. Gate spacers 123 may be disposed on both sidewalls of the peripheral gate electrode 117, respectively. The peripheral source/drain regions 121 may be doped with dopants of a conductivity type different from the conductivity type of the peripheral active portion PA. Differently from the cell transistor, a peripheral transistor including the peripheral gate electrode 117 may have a planar channel region. In other words, the peripheral transistor may be a planar transistor. The peripheral transistor may be a PMOS transistor or a NMOS transistor.

The peripheral dielectric layer 115 may include an oxide (e.g., silicon oxide), a nitride (e.g., silicon nitride), an oxynitride (e.g., silicon oxynitride), and/or a high-k dielectric (e.g., an insulating metal oxide such as hafnium oxide and/or aluminum oxide). The peripheral gate electrode 117 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). The peripheral hard mask pattern 119 may include an oxide (e.g., silicon oxide), a nitride (e.g., silicon nitride), and/or an oxynitride (e.g., silicon oxynitride). The gate spacer 123 may include an oxide (e.g., silicon oxide), a nitride (e.g., silicon nitride), and/or an oxynitride (e.g., silicon oxynitride).

Referring to FIGS. 1A to 1C, a first interlayer insulating layer 125 may be disposed on the semiconductor substrate 100. Source lines SL may fill source-grooves formed in the first interlayer insulating layer 125 in the cell region 10, respectively. The source lines SL may extend in parallel along the second direction D2. Each of the source lines SL may be electrically connected to the first doped regions 110a arranged in the second direction D2. A top surface of the source line SL may be substantially coplanar with a top surface of the first interlayer insulating layer 125. The source line SL may include at least one of at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

A peripheral plug PC may be disposed in a peripheral hole formed in the first interlayer insulating layer 125 in the peripheral region 20. The peripheral plug PC may be electrically connected to the peripheral source/drain region 121. The peripheral plug PC may be formed of the same conductive material as the source line SL. A top surface of the peripheral plug PC may be substantially coplanar with the top surface of the first interlayer insulating layer 125.

A capping interlayer insulating layer 127 may be disposed on the first interlayer insulating layer 125. The capping interlayer insulating layer 127 may cover the top surfaces of the sources lines SL. If the source lines SL includes a metal, the capping interlayer insulating layer 127 may be formed of an insulating material blocking metal atoms in the source lines SL from being diffused into a second interlayer insulating layer 130. Additionally, the capping interlayer insulating layer 127 may be formed of an insulating material having an etch selectivity with respect to the first interlayer insulating layer 125. For example, the first interlayer insulating layer 125 may be formed of an oxide (e.g., silicon oxide), and the capping interlayer insulating layer 127 may be formed of a nitride (e.g., silicon nitride) and/or an oxynitride (e.g., silicon oxynitride).

The second interlayer insulating layer 130 may be disposed on the capping interlayer insulating layer 127. The second interlayer insulating layer 130 may be formed of an oxide (e.g., silicon oxide).

Contact plugs 135 may sequentially penetrate the second interlayer insulating layer 130, the capping interlayer insulating layer 127, and the first interlayer insulating layer 125 in the cell region 10. Each of the contact plugs 135 may be electrically connected to each of the second doped regions 110b. In an embodiment, ohmic patterns (not illustrated) may be disposed between the second doped region 110b and the contact plug 135, between the source line SL and the first doped region 110a, and between the peripheral plug PC and the peripheral source/drain region 121, respectively. The ohmic patterns may include a metal-semiconductor compound (e.g., a metal silicide such as a cobalt silicide or a titanium silicide).

Data storage elements DS may be disposed on the second interlayer insulating layer 130 in the cell region 10. The data storage elements DS may be connected to the contact plugs 135, respectively. The data storage elements DS may be electrically connected to the second doped regions 110b through the contact plugs 135, respectively. As illustrated in FIG. 1A, the data storage elements DS may be two-dimensionally arranged along rows and columns in a plan view.

A thickness of the second interlayer insulating layer 130 in the peripheral region 20 may be smaller than a minimum thickness of the second interlayer insulating layer 130 in the cell region 10. The second interlayer insulating layer 130 in the cell region 10 may include a first portion disposed under the data storage element DS and a second portion disposed around the data storage element DS. The first portion of the second interlayer insulating layer 130 in the cell region 10 may be thicker than the second portion of the second interlayer insulating layer 130 in the cell region 10. Here, the thickness of the second interlayer insulating layer 130 in the peripheral region 20 may be smaller than a thickness of the second portion of the second interlayer insulating layer 130 in the cell region 10.

A protecting insulating layer 137 may be conformally formed on surfaces of the data storage elements DS and the second interlayer insulating layer 130. The protecting insulating layer 137 may protect at least the sidewalls of the data storage elements DS. For example, the protecting insulating layer 137 may include a nitride (e.g., silicon nitride) and/or an oxynitride (e.g., silicon oxynitride).

A mold layer ML may be disposed on the protecting insulating layer 137. In more detail, the mold layer ML may include a first mold layer 140, an etch stop layer 143, and a second mold layer 150 which are sequentially stacked. The first mold layer 140 in the cell region 10 may fill a space between the data storage elements DS. In an embodiment, the second mold layer 150 in the cell region 10 may be disposed directly on the etch stop layer 143 in the cell region 10.

On the contrary, a planarizing insulating layer 145 may be disposed between the etch stop layer 143 and the second mold layer 150 in the peripheral region 20. Since the data storage elements DS are disposed in the peripheral region 20, a top surface of the first mold layer 140 in the cell region 10 may be higher than a top surface of the first mold layer 140 in the peripheral region 20. Thus, a height difference may occur between the cell region 10 and the peripheral region 20. The planarizing insulating layer 145 may reduce the height difference between the cell and peripheral regions 10 and 20. A top surface of the second mold layer 150 in the cell region 10 may be disposed at substantially the same height as a top surface of the second mold layer 150 in the peripheral region 20 due to the planarizing insulating layer 145. In an embodiment, the planarizing insulating layer 145 may be confined in the peripheral region 20.

The etch stop layer 143 may be formed of an insulating material having an etch selectivity with respect to the first mold layer 140. For example, the first mold layer 140 may be formed of an oxide (e.g., silicon oxide), and the etch stop layer 143 may be formed of a nitride (e.g., silicon nitride) and/or an oxynitride (e.g., silicon oxynitride). The second mold layer 150 may be formed of an oxide (e.g., silicon oxide) or other suitable insulating materials. The planarizing insulating layer 145 may be formed of an insulating material having an etch selectivity with respect to the etch stop layer 143. For example, the planarizing insulating layer 145 may be formed of an oxide (e.g., silicon oxide) or other suitable insulating materials.

In other embodiments, if the first mold layer 140 is sufficiently thick, the second mold layer 150 may be omitted, or the second mold layer 150 and the etch stop layer 143 may be omitted. If the second mold layer 150 is omitted, a top surface of the etch stop layer 143 in the cell region 10 may be substantially coplanar with a top surface of the planarizing insulating layer 145 in the peripheral region 20. If the second mold layer 150 and the etch stop layer 143 are omitted, the top surface of the first mold layer 140 in the cell region 10 may be substantially coplanar with the top surface of the planarizing insulating layer 145 in the peripheral region 20.

The mold layer ML may not be limited to the above described embodiments and can have various modifications. Therefore, the mold layer ML including the first mold layer 140, the etch stop layer 143 and the second mold layer 150 described above and hereinafter are merely some examples. A bit line BL may be disposed in a cell groove G1 sequentially penetrating the mold layer ML and the protecting insulating layer 137. The bit line BL may be in direct contact with a top surface of the data storage element DS. In other words, a contact plug does not exist between the bit line BL and the data storage element DS. Thus, a manufacturing process of the semiconductor memory device may be simplified, and a resistance between the bit line BL and the data storage element DS may be reduced. In some embodiments, the bit line BL may not be disposed in a groove, but on a flat surface.

The cell groove G1 exposes at least a portion of the data storage element DS. In more detail, the cell groove G1 extends in the first direction D1. The cell groove G1 may expose a plurality of the data storage elements DS arranged in the first direction D1. The cell groove G1 may overlap the active line pattern ALP. Thus, a plurality of the cell grooves G1 may be disposed over the active line patterns ALP, respectively.

The bit line BL and the data storage element DS will be described in more detail with reference to FIG. 2A.

Referring to FIGS. 1A, 1B, 1C, and 2A, a width W2 of a bottom surface of the bit line BL in the second direction D2 may be smaller than a width W1 of the top surface of the data storage element DS in the second direction D2. Thus, it is possible to secure an alignment margin between the bit line BL and the data storage element DS. Additionally, reliability of the data storage element DS may be sufficiently secured.

If the width of the bottom surface of the bit line BL is greater than the width of the top surface of the data storage element DS, both sidewalls of the data storage element DS parallel to both sidewalls of the bit line BL may be damaged by over-etching of an etching process for forming the cell groove G1. Thus, reliability of the data storage element DS may be deteriorated. However, according to the inventive concept as described above, the width W2 of the bottom surface of the bit line BL is smaller than the width W1 of the top surface of the data storage element DS. Thus, it is possible to substantially reduce the deterioration of the reliability of the data storage element DS.

As illustrated in FIGS. 1B and 2A, the bottom surface of the bit line BL may be in contact with a center portion of the top surface of the data storage element DS. Here, the center portion of the top surface of the data storage element DS may be recessed to be lower than an edge portion of the top surface of the data storage element DS. Thus, a contact area between the bit line BL and the data storage element DS may increase to reduce the resistance between the bit line BL and the data storage element DS.

In more detail, as illustrated in FIG. 2A, the data storage element DS may include a magnetic tunnel junction pattern MTJ. The magnetic tunnel junction pattern MTJ may include a reference magnetic pattern HRL, a free magnetic pattern HFL, and a tunnel barrier TB disposed between the reference and free magnetic patterns HRL and HFL. The data storage element DS further includes a capping pattern 210 disposed on the magnetic tunnel junction pattern MTJ and a lower electrode 200 disposed under the magnetic tunnel junction pattern MTJ. Sidewalls of the lower electrode 200, the magnetic tunnel junction pattern MTJ, and the capping pattern 210 may be aligned with each other.

The top surface of the data storage element DS corresponds to a top surface of the capping pattern 210. In other words, the bit line 30 may be in contact with a center portion of the top surface of the capping pattern 210, and the center portion of the top surface of the capping pattern 210 is recessed to be lower than an edge portion of the top surface of the capping pattern 210. Here, the recessed center portion of the top surface of the capping pattern 210 is higher than a bottom surface of the capping pattern 210.

In an embodiment, the capping pattern 210 may include a metal-compound pattern 205 and a metal pattern 207 which are sequentially stacked. The metal-compound pattern 205 may include at least one of a metal nitride (e.g., titanium nitride or tantalum nitride) or a metal oxide (e.g., tantalum oxide). For example, the metal pattern 207 may include tungsten. When the capping pattern 210 includes the metal-compound pattern 205 and the metal pattern 207, the recessed center portion of the top surface of the capping pattern 210 may be higher than a bottom surface of the metal pattern 207. In other words, the bit line BL may be in contact with the metal pattern 207.

As illustrated in FIGS. 1B and 2A, a width of a top surface of the bit line BL may be greater than the width W2 of the bottom surface of the bit line BL. In this case, a sidewall of the bit line BL may be inclined.

In an embodiment, as illustrated in FIG. 1B, the bottom surface of the bit line BL may include a first portion B1 contacting the top surface of the data storage element DS and a second portion B2 not contacting the top surface of the data storage element DS. For example, the second portion B2 of the bottom surface of the bit line BL may be in contact with the first mold layer 140. The second portion B2 of the bottom surface of the bit line BL may be lower than the recessed center portion of the top surface of the data storage element DS.

The lower electrode 200 may include a metal nitride (e.g., titanium nitride, tantalum nitride, and/or tungsten nitride).

Referring to FIG. 2A, the reference magnetic pattern HRL may have a magnetization direction 225H fixed in one direction, and the free magnetic pattern HFL may have a magnetization direction 235H configured to be changeable to a direction substantially parallel to or anti-parallel to the magnetization direction 225H of the reference magnetic pattern HRL. In an embodiment, as illustrated in FIG. 2A, the magnetization directions 225H and 235H of the reference and free magnetic patterns HRL and HFL may be substantially parallel to one surface of the tunnel barrier TB which is in contact with the free magnetic pattern HFL.

If the magnetization direction 235H of the free magnetic pattern HFL is parallel to the magnetization direction 225H of the reference magnetic pattern HRL, the data storage element DS has a first resistance value. If the magnetization direction 235H of the free magnetic pattern HFL is anti-parallel to the magnetization direction 225H of the reference magnetic pattern HRL, the data storage element DS has a second resistance value greater than the first resistance value. The data storage element DS may store data by using the difference between the first and second resistance values. The magnetization direction 235H of the free magnetic pattern HFL may be changeable by spin torque of electrons in a program current.

As illustrated in FIG. 2A, the reference magnetic pattern HRL, the tunnel barrier TB, and the free magnetic pattern HFL may be sequentially stacked on the lower electrode 200, and the capping pattern 210 may be disposed on a top surface of the free magnetic pattern HFL. Alternatively, the free magnetic pattern HFL, the tunnel barrier TB, and the reference magnetic pattern HRL may be sequentially stacked on the lower electrode 200, and the capping pattern 210 may be disposed on a top surface of the reference magnetic pattern HRL.

Each of the reference and free magnetic patterns HRL and HFL may include a ferromagnetic material. The reference magnetic pattern HRL may further include an anti-ferromagnetic material for pinning a magnetization direction of the ferromagnetic material in the reference magnetic pattern HRL. The tunnel barrier TB may include at least one of magnesium oxide, titanium oxide, aluminum oxide, magnesium-zinc oxide, and magnesium-boron oxide.

In some other embodiments, a data storage element DS" having a dual magnetic tunnel junction (DMTJ) may be employed. In detail, the DMTJ includes a first tunnel barrier 231, a second tunnel barrier 235, a free layer 233, a first reference layer 237, and a second reference layer 239 as shown in FIG. 2C. Although not specifically illustrated, the DMTJ may be a perpendicular MTJ, a planar MTJ explained above or a combination thereof depending on the desired applications.

Referring to FIGS. 1A to 1C, a peripheral wire PW may be disposed in a peripheral groove G2 which sequentially penetrates the second mold layer 150, the planarizing insulating layer 145, the etch stop layer 143, the first mold layer 140, the protecting insulating layer 137, the second interlayer insulating layer 130, and the capping interlayer insulating layer 127. The peripheral wire PW may be connected to the top surface of the peripheral plug PC. In a plan view, the peripheral wire PW may have a line-shape extending in one direction.

A top surface of the peripheral wire PW may be substantially coplanar with a top surface of the bit line BL. On the contrary, a bottom surface of the peripheral wire PW may be disposed at a level lower than the bottom surface of the bit line BL. In other words, a height of the peripheral wire PW may be greater than a height of the bit line BL. In an embodiment, the peripheral wire PW may be in contact with one of the bit lines BL without an interface.

As illustrated in FIG. 1C, a width of a bottom surface of the peripheral wire PW may be smaller than a width of a top surface of the peripheral plug PC. However, the inventive concept is not limited thereto. In other embodiments, the width of the bottom surface of the peripheral wire PW may be greater than the width of the top surface of the peripheral plug PC.

The bit line BL includes a metal. For example, the bit line BL may include aluminum or copper. Particularly, the bit line BL may include copper. Since the bit line BL includes copper, the process temperature for forming the bit line BL may be reduced. As a result, it is possible to substantially reduce the deterioration of the reliability of the data storage element DS including the magnetic tunnel junction pattern MTJ. The bit line BL may further include a barrier metal and/or a glue metal. The peripheral wire PW may be formed of the same conductive material as the bit line BL.

According to the aforementioned semiconductor memory device, the cell transistor may include the cell gate electrode CG disposed in the gate recess region 104c, and the bit line BL may be in direct contact with the top surface of the data storage element DS. Thus, the cell transistor includes the recessed channel region having a three-dimensional structure, so that it is possible to realize the cell transistor capable of substantially reducing a short channel effect in a limited area. Also, since the bit line BL is in contact with the top surface of the data storage element DS, it is possible to reduce the resistance between the bit line BL and the data storage element DS. As a result, it is possible to realize the semiconductor memory device with high integration and excellent reliability.

Additionally, the width W2 of the bottom surface of the bit line BL is smaller than the width W1 of the top surface of the data storage element DS, such that it is possible to secure the alignment margin between the bit line BL and the data storage element DS and to substantially reduce the deterioration of the reliability of the data storage element DS.

Figure 2B:
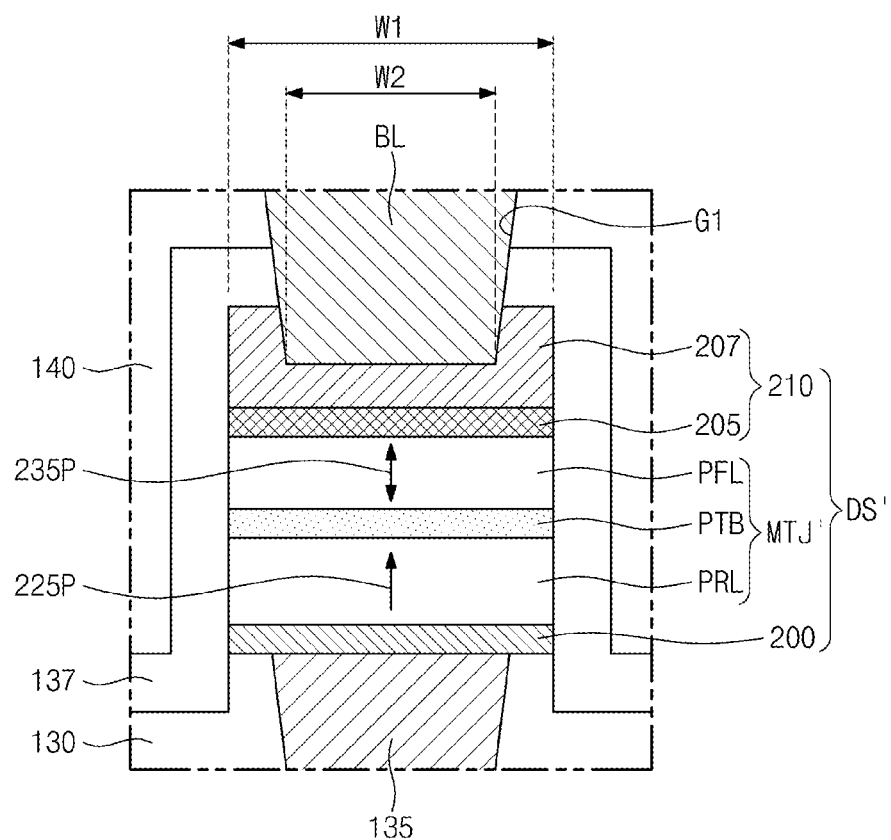
FIG. 2B is an enlarged view of a portion 'K' of FIG. 1B to explain a data storage element in a semiconductor memory device according to other embodiments of the inventive concept.
Figure 2C:
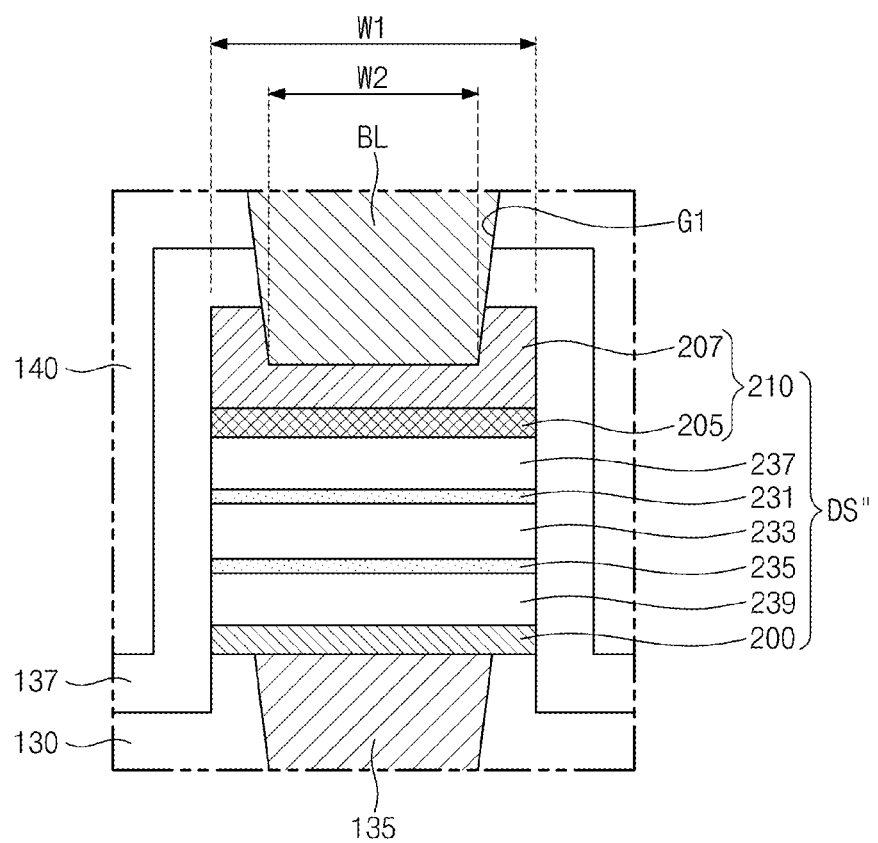
FIG. 2C is another data storage element in a semiconductor memory device according to other embodiments of the inventive concept.

FIG. 2B is an enlarged view of a portion 'K' of FIG. 1B to explain a data storage element in a semiconductor memory device according to other embodiments of the inventive concept.

Referring to FIG. 2B, a data storage element DS' according to the present embodiment may include a magnetic tunnel junction pattern MTJ'. The magnetic tunnel junction pattern MTJ' may include a perpendicular reference magnetic pattern PRL, a perpendicular free magnetic pattern PFL, and a tunnel barrier PTB disposed between the perpendicular reference and free magnetic patterns PRL and PFL. The perpendicular reference magnetic pattern PRL may have a fixed magnetization direction 225P, and the perpendicular free magnetic pattern PFL may have a magnetization direction 235P changeable to a direction substantially parallel to or anti-parallel to the fixed magnetization direction 225P of the perpendicular reference magnetic pattern PRL. Here, the magnetization directions 225P and 235P of the perpendicular reference and free magnetic patterns PRL and PFL may be substantially perpendicular to one surface of the tunnel barrier PTB which is in contact with the perpendicular free magnetic pattern PFL.

Each of the perpendicular reference and free magnetic patterns PRL and PFL may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, and a perpendicular magnetic structure. The perpendicular magnetic material having the $L1_0$ structure may include at least one of FePt having the $L1_0$ structure, FePd having the $L1_0$ structure, CoPd having the $L1_0$ structure, and CoPt having the $L1_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where 'n' denotes a stacking number of the magnetic layer and the non-magnetic layer). Here, the perpendicular reference magnetic pattern PRL may be thicker than the perpendicular free magnetic pattern PFL, and/or the coercive force of the perpendicular reference magnetic pattern PRL may be greater than that of the perpendicular free magnetic pattern PFL. The tunnel barrier PTB may include at least one of the following: magnesium oxide, titanium oxide, aluminum oxide, magnesium-zinc oxide, and magnesium-boron oxide.

FIGS. 3 to 11 are cross-sectional views illustrating a method of manufacturing a semiconductor memory device according to exemplary embodiments of the inventive concept.

Figure 3:
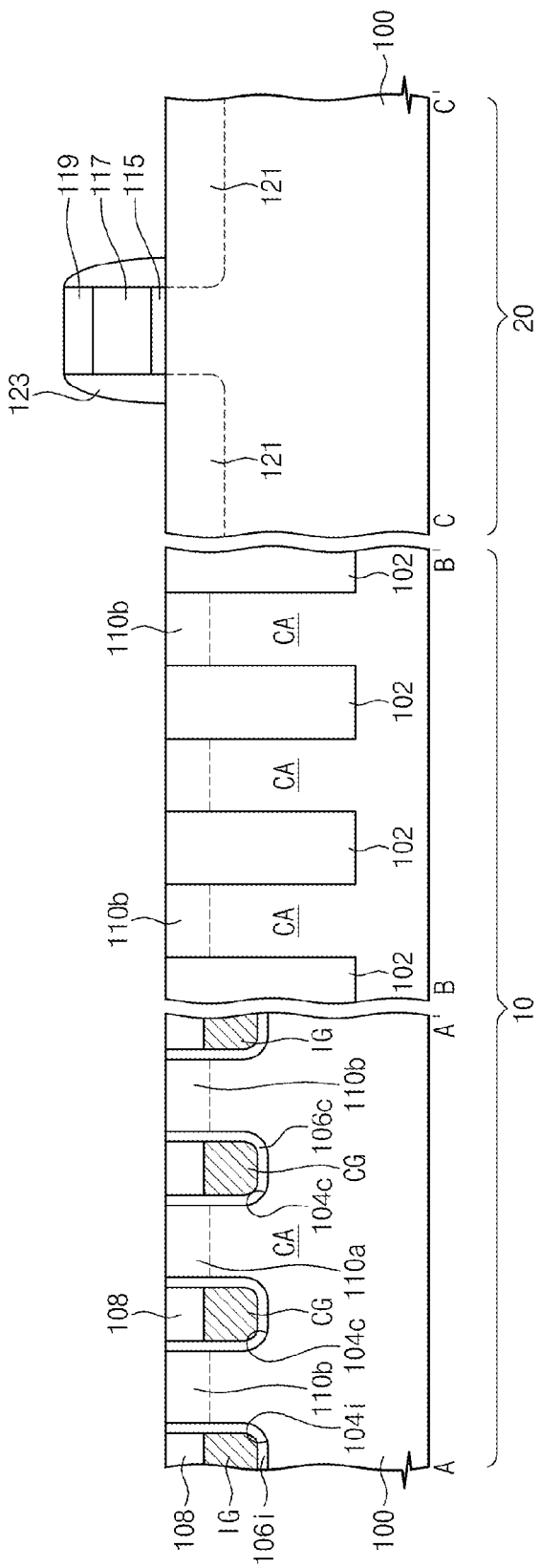
FIGS. 3 to 11 are cross-sectional views illustrating a method of manufacturing a semiconductor memory device according to exemplary embodiments of the inventive concept.

Referring to FIG. 3, a semiconductor substrate 100 including a cell region 10 and a peripheral region 20 is prepared. Device isolation patterns 102 may be formed in the semiconductor substrate 100 to define active line patterns ALP in the cell region 10 and a peripheral active portion PA in the peripheral region 20. The active line patterns ALP may extend in parallel to each other in the first direction D1 of FIG. 1A.

The active line patterns ALP and the device isolation patterns 102 in the cell region 10 may be patterned to form gate recess regions 104c and isolation recess regions 104i extending in parallel to each other in the second direction D2 of FIG. 1A. The isolation recess regions 104i may divide each of the active line patterns ALP into a plurality of cell active portions CA. The gate recess regions 104c may cross the cell active portions CA. A depth of each of the gate and isolation recess regions 104c and 104i may be smaller than a depth of a bottom surface of the device isolation pattern 102.

A cell gate dielectric layer 106c may be formed on an inner surface of each of the gate recess regions 104c with a substantially uniform thickness. An isolation gate dielectric layer 106i may be formed on an inner surface of each of the isolation recess regions 104i with a substantially uniform thickness. In an embodiment, the cell and isolation gate dielectric layers 106c and 106i may be formed simultaneously.

Subsequently, a conductive layer may be formed to fill the recess regions 104c and 104i. The conductive layer may be etched to form a cell gate electrode CG in each of the gate recess regions 104c and an isolation gate electrode IG in each of the isolation recess regions 104i. As illustrated in FIG. 3, top surfaces of the cell and isolation gate electrodes CG and IG may be recessed to be lower than a top surface of the semiconductor substrate 100.

A hard mask layer may be formed on the semiconductor substrate 100 to fill the recess regions 104c and 104i on the cell and isolation gate electrodes CG and IG. The hard mask layer may be planarized to form gate hard mask patterns 108 in the recess regions 104c and 104i, respectively.

Dopants may be injected into each of the cell active portions CA at both sides of each of the cell gate electrodes CG to form a first doped region 110a and a second doped region 110b. Bottom surfaces of the first and second doped regions 110a and 110b may be disposed at a level higher than a bottom end of the cell gate electrode CG.

A peripheral gate dielectric layer 115, a peripheral gate electrode 117, and a peripheral gate hard mask pattern 119 may be sequentially stacked on the peripheral active portion PA in the peripheral region 20. Peripheral source/drain regions 121 may be formed in the peripheral active portion PA at both sides of the peripheral gate electrode 117, respectively. Gate spacers 123 may be formed on both sidewalls of the peripheral gate electrode 117, respectively.

A peripheral transistor including the peripheral gate electrode 117 may be formed after a cell transistor including the cell gate electrode CG is formed. Alternatively, the cell transistor may be formed after the formation of the peripheral transistor.

Figure 4:
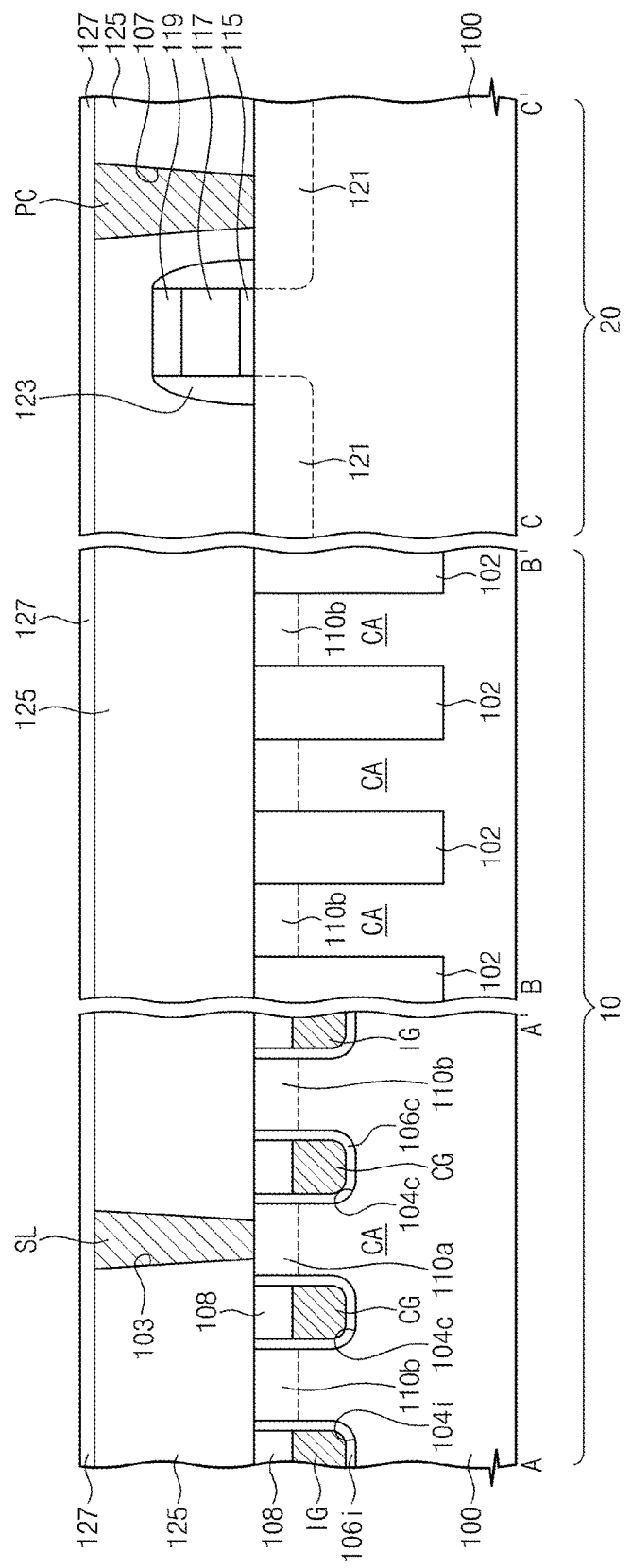

Referring to FIG. 4, a first interlayer insulating layer 125 may be formed on the semiconductor substrate 100. The first interlayer insulating layer 125 in the cell region 10 may be patterned to form a source-groove 103. The first interlayer insulating layer 125 in the peripheral region 20 may be patterned to form a peripheral hole 107. In an embodiment, the source-groove 103 and the peripheral hole 107 may be formed at the same time.

A conductive layer may be formed to fill the source-groove 103 and the peripheral hole 107, and then the conductive layer may be planarized until the first interlayer insulating layer 125 is exposed, thereby forming a source line SL in the source-groove 103 and a peripheral plug PC in the peripheral hole 107. The source line SL may be connected to the first doped region 112a, and the peripheral plug PC may be connected to the peripheral source/drain region 121.

Next, a capping interlayer insulating layer 127 may be formed on the first interlayer insulating layer 125, the source line SL, and the peripheral plug PC.

Figure 5:
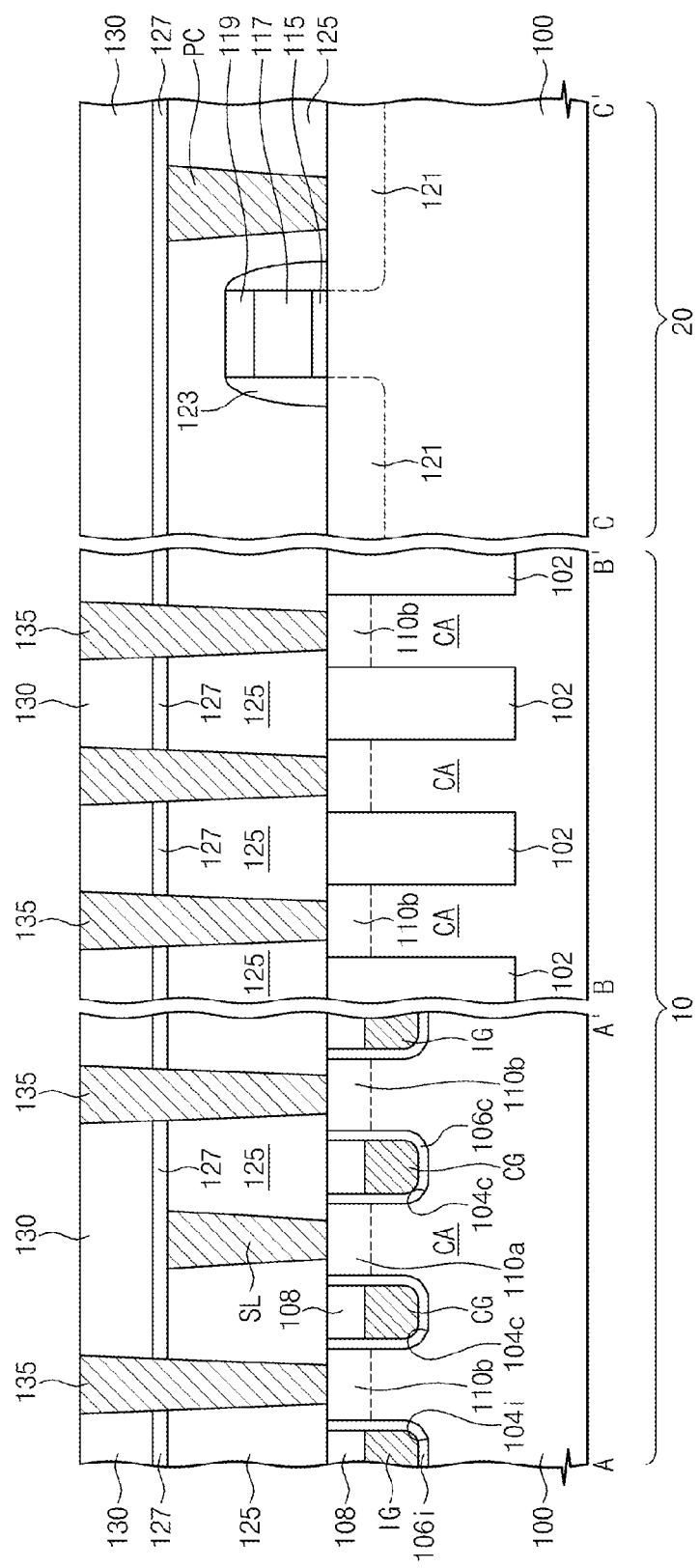

Referring to FIG. 5, a second interlayer insulating layer 130 may be formed on the capping interlayer insulating layer 127. Contact plugs 135 may be formed to sequentially penetrate the second interlayer insulating layer 130, the capping interlayer insulating layer 127, and the first interlayer insulating layer 125. The contact plugs 135 may be connected to the second doped regions 110b, respectively.

Figure 6:
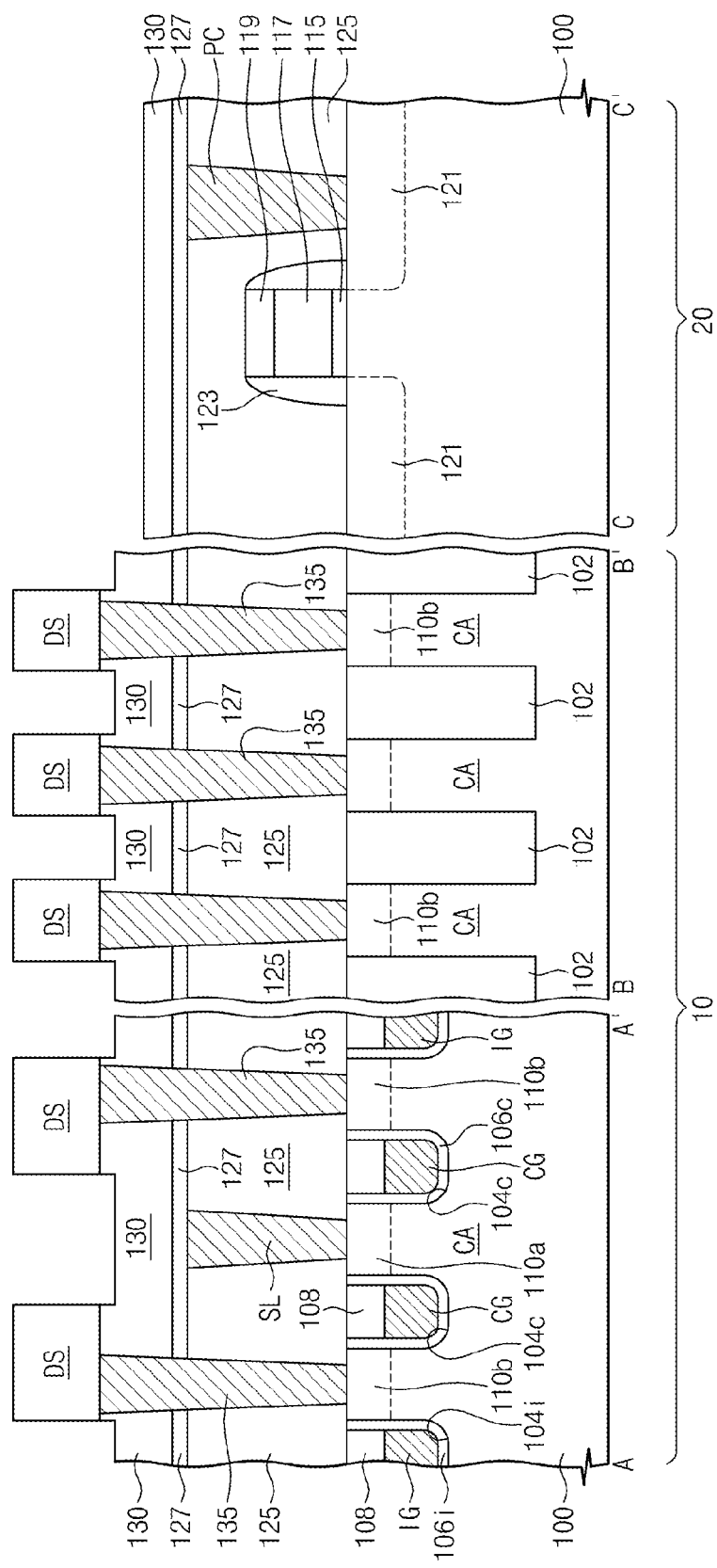

Referring to FIG. 6, a data storage layer may be formed on the second interlayer insulating layer 130. In an embodiment, the data storage layer may include a lower electrode layer, a magnetic tunnel junction layer, and a capping layer which are sequentially stacked.

The data storage layer may be patterned to form data storage elements DS in the cell region 10. The data storage elements DS may be connected to the contact plugs 135, respectively. The data storage elements DS may be realized as illustrated in FIG. 2A. Alternatively, the data storage elements DS may be realized as the data storage element DS' illustrated in FIG. 2B. ADD DIFFERENT EMBODIMENTS When the data storage layer is patterned, the second interlayer insulating layer 130 may be recessed by overetching. At this time, the second interlayer insulating layer 130 in the peripheral region 20 may be more recessed than the second interlayer insulating layer 130 around the data storage elements DS in the cell region 10 by a loading effect. Thus, a thickness of the second interlayer insulating layer 130 in the peripheral region 20 may be smaller than a minimum thickness of the second interlayer insulating layer 130 in the cell region 10 after the data storage elements DS are formed, as illustrated in FIG. 6.

Figure 7:
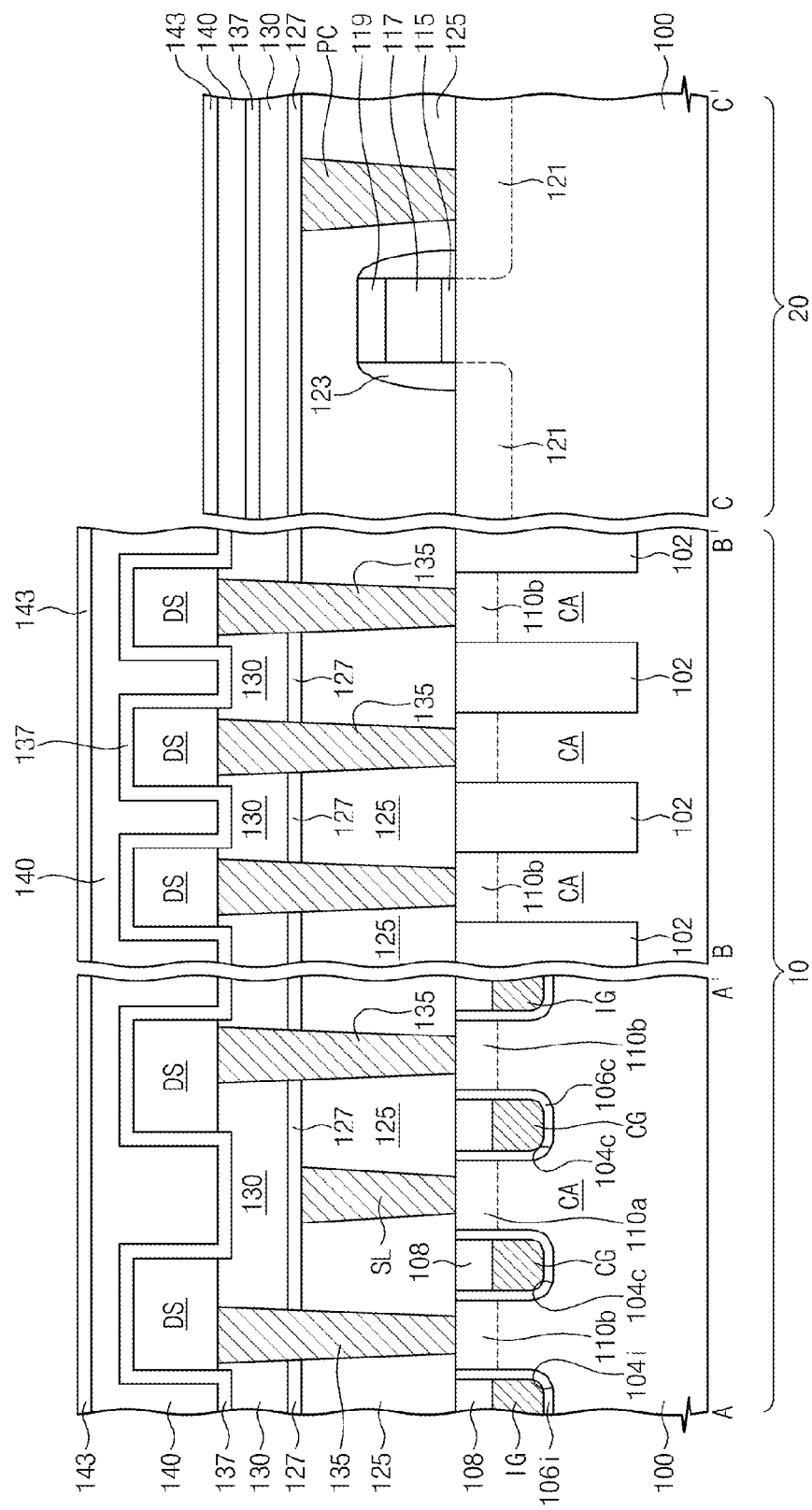

Referring to FIG. 7, subsequently, a protecting insulating layer 137 may be conformally formed on the semiconductor substrate 100. The protecting insulating layer 137 may be formed by a chemical vapor deposition (CVD) process and/or an atomic layer deposition (ALD) process or other suitable processes. A first mold layer 140 may be formed on the protecting insulating layer 137. The first mold layer 140 may fill a space between the data storage elements DS in the cell region 10. The first mold layer 140 may be formed by a CVD process and/or an ALD process or other suitable processes. An etch stop layer 143 may be formed on the first mold layer 140.

Figure 8:
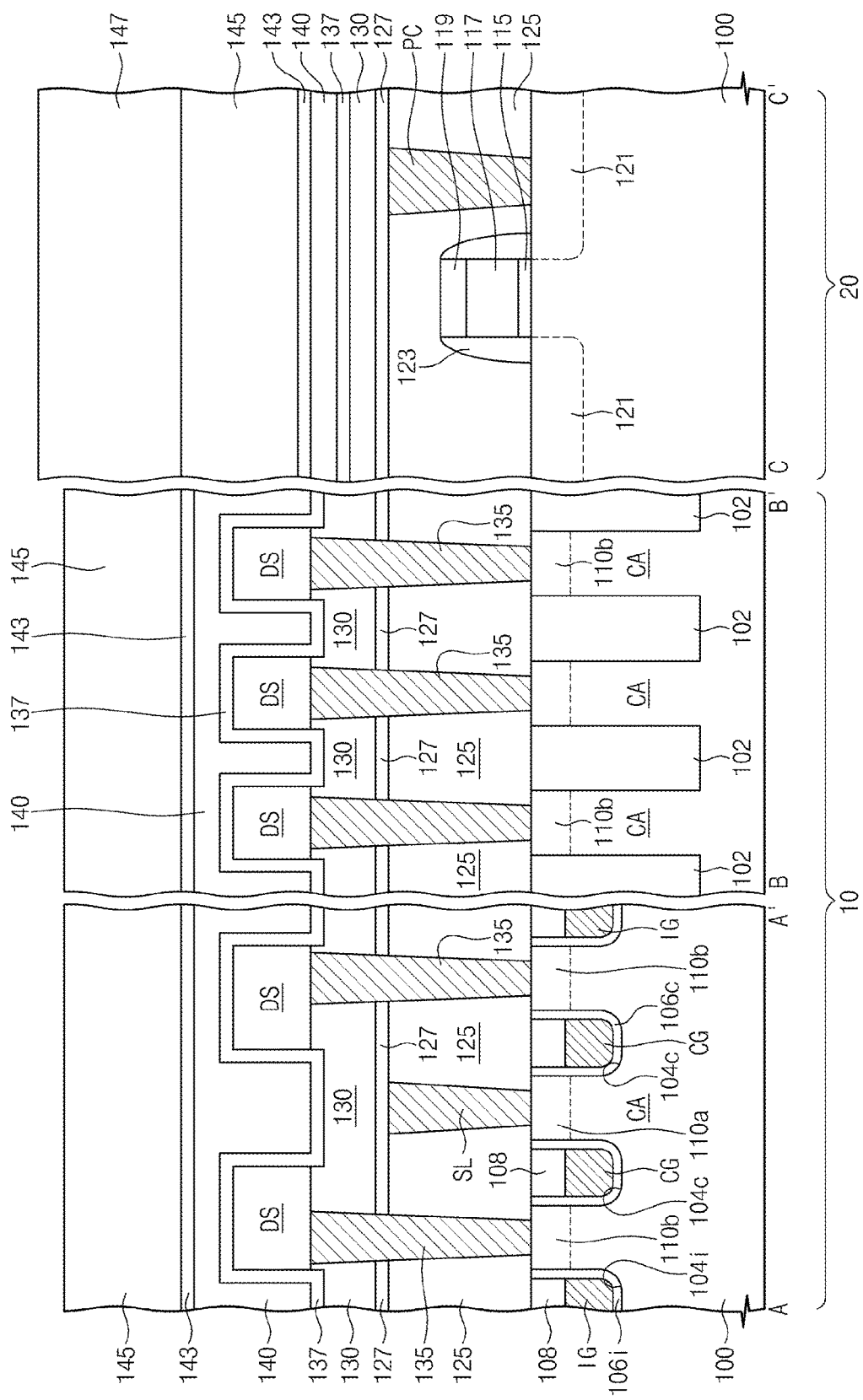

Referring to FIG. 8, a planarizing insulating layer 145 may be formed on substantially the entire surface of the etch stop layer 143. At this time, a height difference may occur between the planarizing insulating layer 145 of the cell region 10 and the planarizing insulating layer 145 of the peripheral region 20 due to the recessing phenomenon of the second interlayer insulating layer 130 caused by the data storage elements DS and/or a loading effect. In other words, a top surface of the planarizing insulating layer 145 in the cell region 10 may be higher than a top surface of the planarizing insulating layer 145 in the peripheral region 20.

A mask pattern 147 may be formed on the planarizing insulating layer 145 in the peripheral region 20. At this time, the planarizing insulating layer 145 in the cell region 10 may be exposed.

Figure 9:
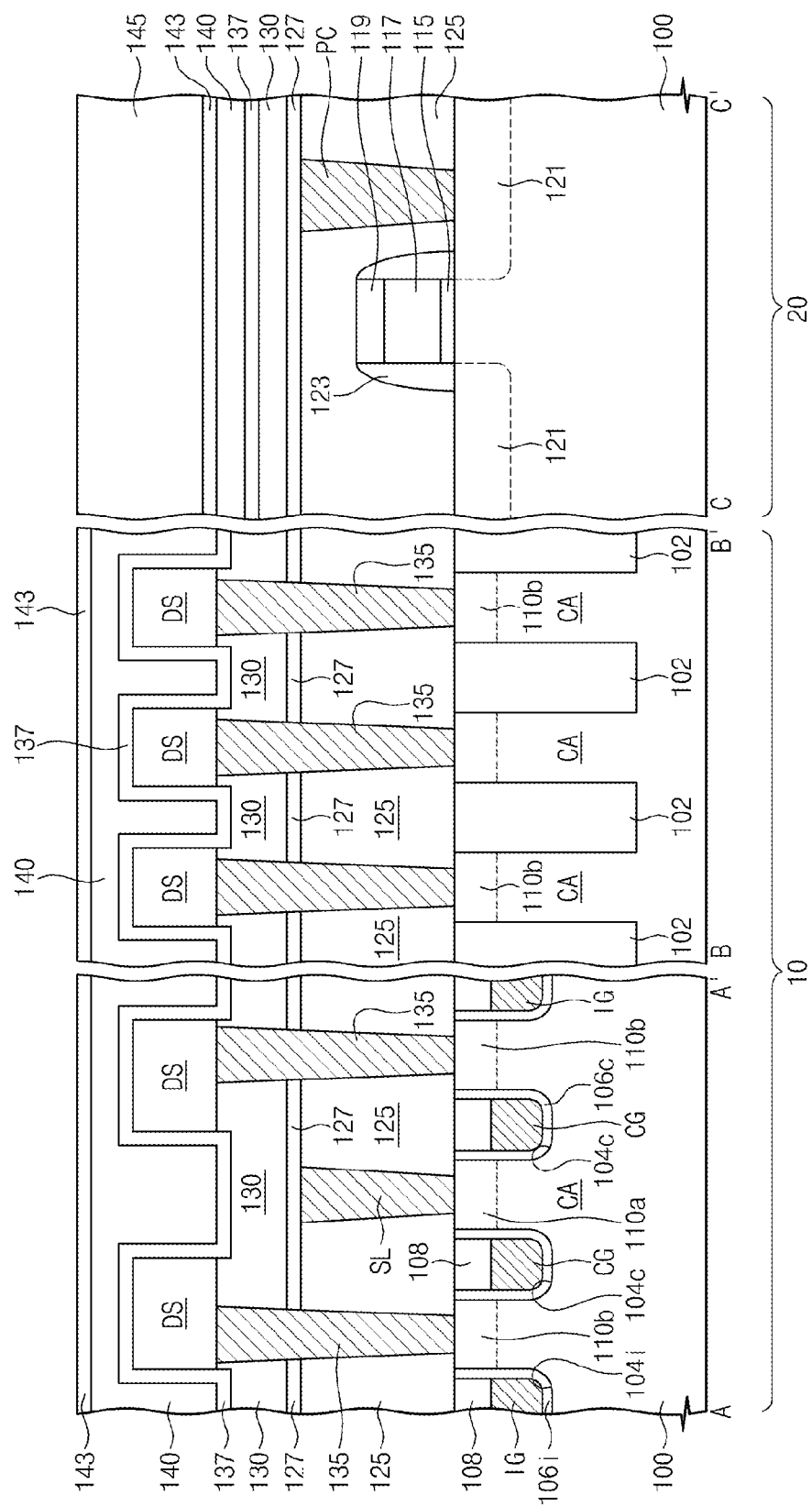

Referring to FIG. 9, the planarizing insulating layer 147 may be etched using the mask pattern 147 as an etch mask until the etch stop layer 143 in the cell region 10 is exposed. Thus, it is possible to minimize the height difference between the cell and the peripheral regions 10 and 20. Next, the mask layer 147 may be removed to expose the planarizing insulating layer 145 in the peripheral region 20. In other words, the planarizing insulating layer 145 may remain in the peripheral region 20.

Figure 10:
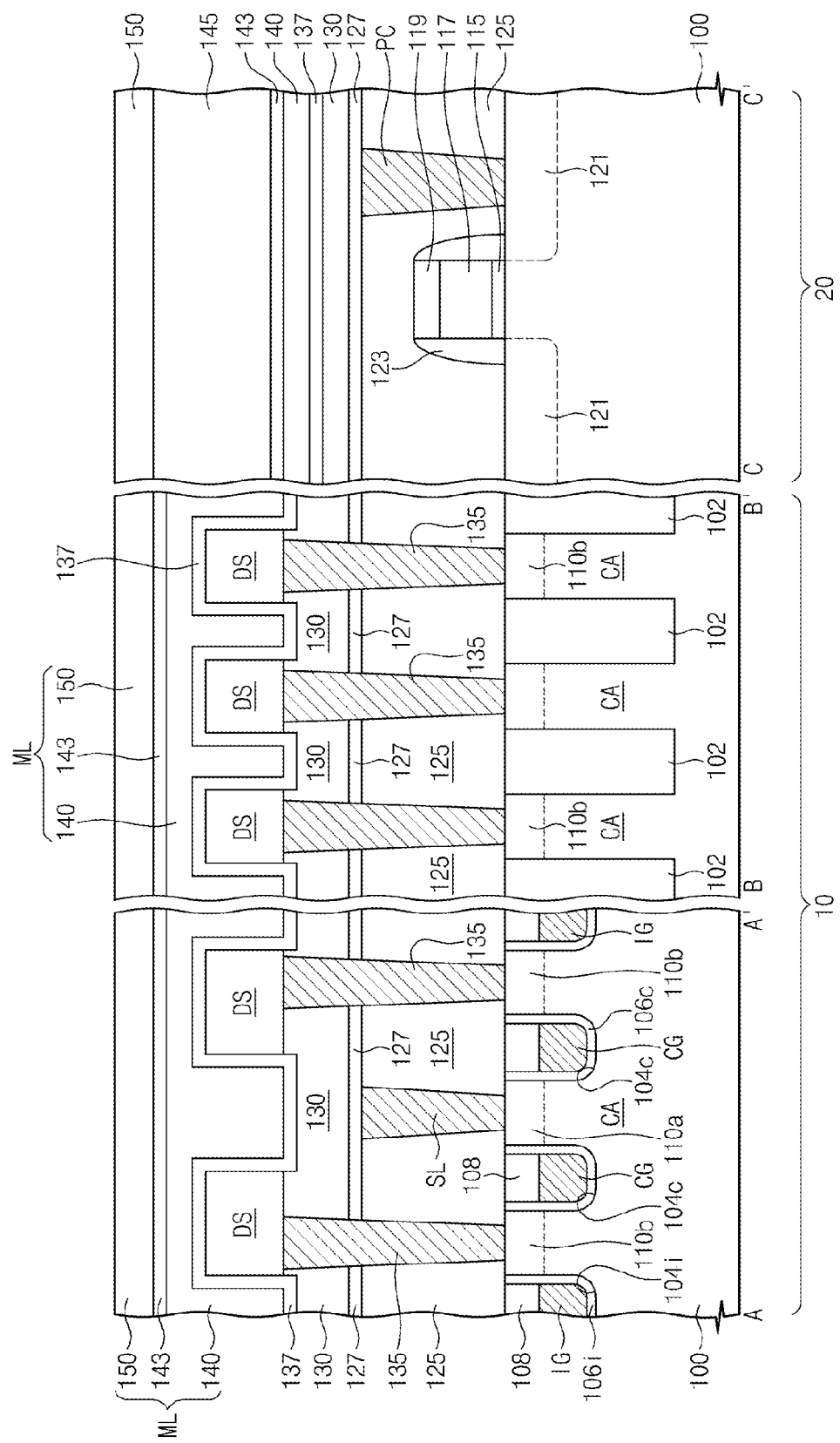

Referring to FIG. 10, subsequently, a second mold layer 150 may be formed over the planarizing insulating layer 145 in the peripheral region 20 and over the exposed etch stop layer 143 in the cell region 10. A top surface of the second mold layer 150 may be substantially flattened by the planarizing process described with reference to FIGS. 8 and 9. The first mold layer 140, the etch stop layer 143, and the second mold layer 150 in the cell region 10 may constitute a mold layer ML.

Figure 11:
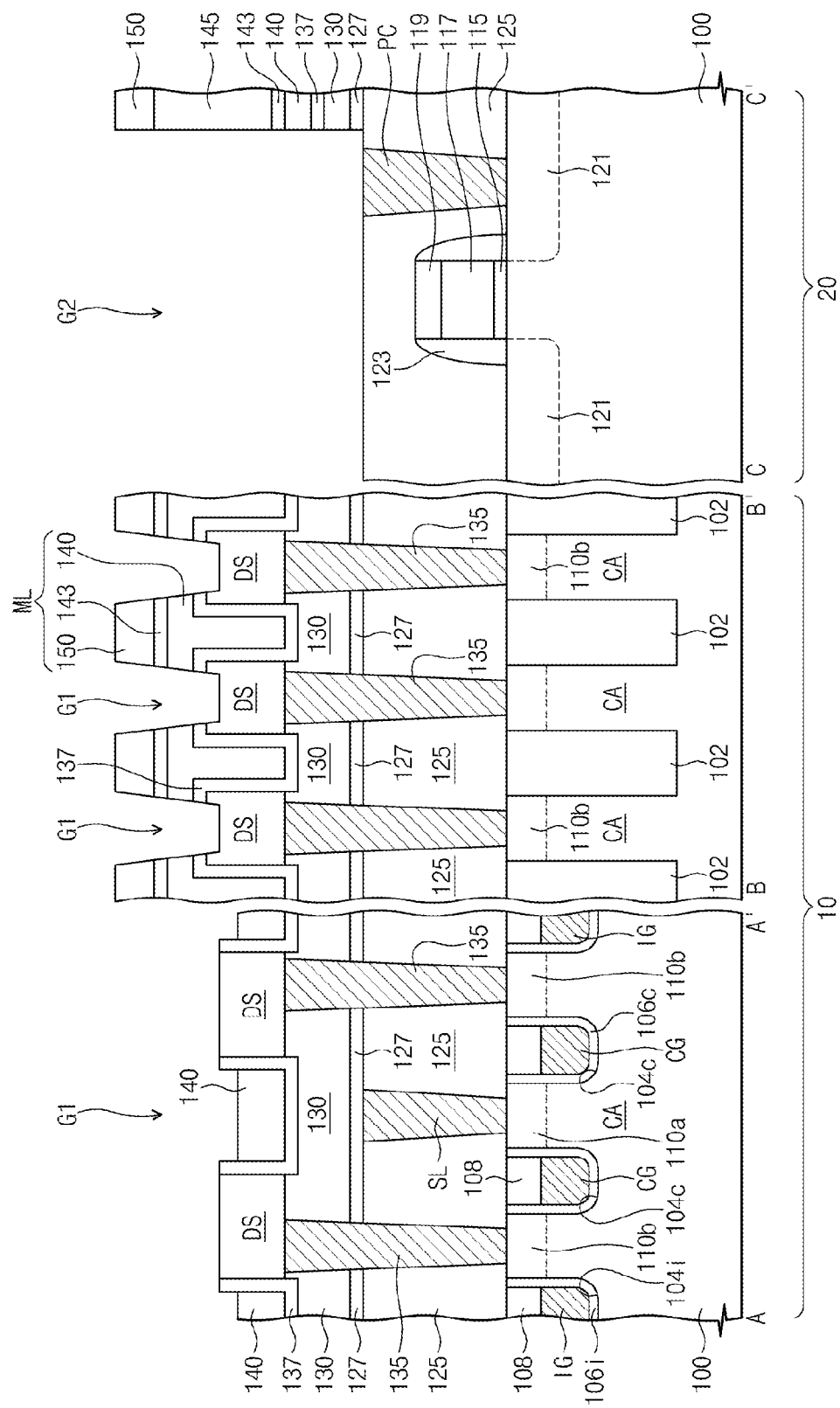

Referring to FIG. 11, the mold layer ML and the protecting insulating layer 137 in the cell region 10 may be patterned to form a cell groove G1 exposing the data storage element DS. The cell groove G1 may extend in the first direction D1 of FIG. 1A and expose a plurality of the data storage elements DS arranged in the first direction D1.

A width of a bottom surface of the cell groove G1 may be smaller than a width of the data storage element DS. A sidewall of the cell groove G1 may be inclined. A center portion of a top surface of the data storage element DS, which is exposed by the cell groove G1 may be recessed to be lower than the edge portion of the top surface of the data storage element DS which is covered by the mold layer ML.

A portion of the bottom surface of the cell groove G1, which is formed in the first mold layer 140, may be recessed to be lower than the recessed center portion of the top surface of the data storage element DS.

The second mold layer 150, the planarizing insulating layer 145, the etch stop layer 143, the first mold layer 140, the protecting insulating layer 137, the second interlayer insulating layer 130, the capping interlayer insulating layer 127 in the peripheral region 20 may be sequentially patterned to form a peripheral groove G2. The peripheral groove G2 may have a line-shape in plan view. In an embodiment, the peripheral groove G2 may be laterally connected to one of the cell grooves G1.

The peripheral groove G2 may be formed after the cell grooves G1 are formed. Alternatively, the cell grooves G1 may be formed after the peripheral groove G2 is formed.

Subsequently, a wire-conductive layer may be formed to fill the cell grooves G1 and the peripheral groove G2. The wire-conductive layer may be planarized until the second mold layer 150 is exposed, so that the bit lines BL and the peripheral wire PW of FIGS. 1A to 1C are formed. Thus, top surfaces of the bit lines BL may be substantially coplanar with a top surface of the peripheral wire PW. On the contrary, a bottom surface of the peripheral wire PW may be lower than a bottom surface of the bit line BL. As a result, the semiconductor memory device illustrated in FIGS. 1A to 1C and 2A (or 2B) may be realized.

The semiconductor memory devices described in the aforementioned embodiments may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

Figure 12:
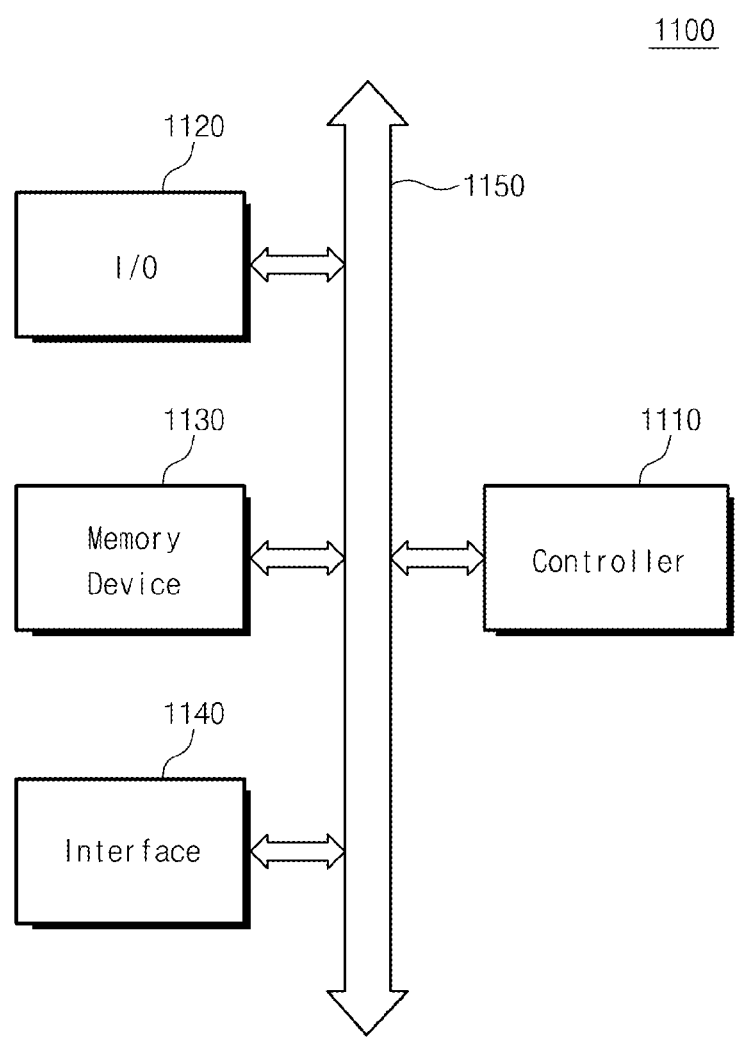
FIG. 12 is a schematic block diagram illustrating an example of electronic systems including semiconductor memory devices according to exemplary embodiments of the inventive concept.

FIG. 12 is a schematic block diagram illustrating an example of electronic systems including semiconductor memory devices according to exemplary embodiments of the inventive concept.

Referring to FIG. 12, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor memory devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 13:
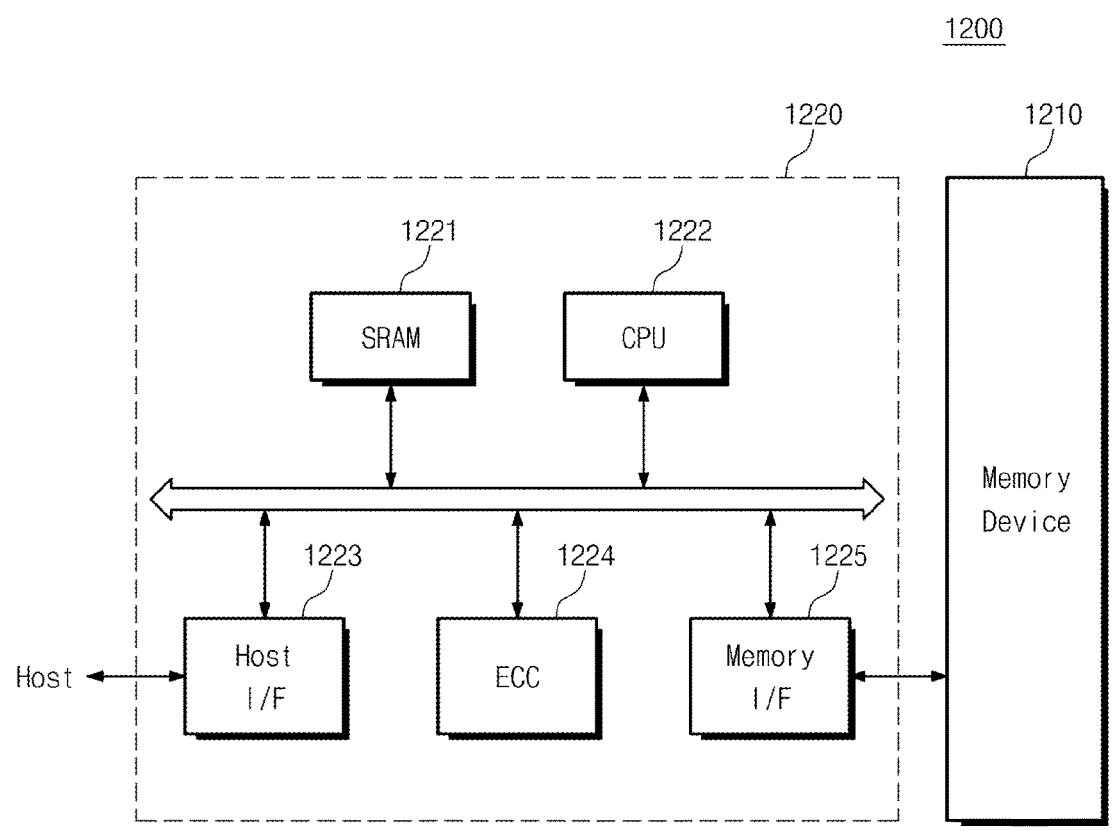
FIG. 13 is a schematic block diagram illustrating an example of memory cards including semiconductor memory devices according to exemplary embodiments of the inventive concept.

FIG. 13 is a schematic block diagram illustrating an example of memory cards including semiconductor memory devices according to exemplary embodiments of the inventive concept.

Referring to FIG. 13, a memory card 1200 according to the inventive concept may include a memory device 1210. The memory device 1210 may include at least one of the semiconductor memory devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to embodiments of the inventive concept, the cell gate electrode is disposed in the gate recess region and the bit line is in direct contact with the top surface of the data storage element. Thus, the cell transistor including the cell gate electrode includes the recessed channel region of the three-dimensional structure, such that the short channel effect may be minimized in the limited area. Also, the bit line is in direct contact with the top surface of the data storage element, such that the resistance between the bit line and the data storage element may be reduced or minimized. As a result, it is possible to realize the semiconductor memory device with high integration and excellent reliability.

Additionally, the width of the bottom surface of the bit line may be smaller than the width of the top surface of the data storage element, such that the alignment margin between the bit line and the data storage element may be improved and the reliability of the data storage element may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a plurality of cell gate electrodes extending in a first direction, each of the cell gate electrodes disposed in a cell region of a semiconductor substrate with a cell gate dielectric layer disposed between the cell gate electrode and the semiconductor substrate;
    a plurality of bit lines extending in a second direction perpendicular to the first direction; and
    a plurality of data storage elements arranged along the first and second directions, the data storage elements electrically connected between the bit lines and a doped region formed adjacent to the cell gate electrode;
    wherein each of the bit lines is in direct contact with the data storage elements arranged along the second direction, and
    wherein each of the bit lines includes first portions contacting with the data storage elements and a second portion between the data storage elements, and
    wherein the first portions have a first thickness and the second portion has a second thickness greater than the first thickness.

2. The semiconductor device of claim 1, wherein widths of bottom surfaces of the bit lines are smaller than corresponding widths of top surfaces of the data storage elements.

3. The semiconductor device of claim 1, further comprising a peripheral gate electrode formed over a flat surface of the semiconductor substrate in a peripheral circuit region.

4. The semiconductor device of claim 1, wherein each of the bit lines has a non-planar bottom surface and a substantially planar top surface.

5. A semiconductor device comprising:
    a semiconductor substrate including a cell region and a peripheral region;
    a cell active portion defined in a semiconductor substrate of the cell region;

a cell gate dielectric layer and a cell gate electrode crossing the cell active portion;
a first doped region and a second doped region within the cell active portion at both sides of the cell gate electrode, respectively;
first and second interlayer insulating layers sequentially stacked on the semiconductor substrate;
a source line disposed in the first interlayer insulating layer and connected to the first doped region, wherein the second interlayer insulating layer covers a top surface of the source line;
a contact plug penetrating the first and second interlayer insulating layers and connected to the second doped region;
a data storage element disposed on the first and second insulating layers and electrically connected to the second doped region through the contact plug;
a mold layer covering the data storage element;
a bit line disposed in a cell groove penetrating the mold layer, the bit line directly contacting a top surface of the data storage element;
a peripheral transistor formed at a peripheral active portion defined at the semiconductor substrate of the peripheral region, the peripheral transistor including a peripheral source/drain region;
a peripheral plug penetrating the first interlayer insulating layer and connected to the peripheral source/drain region; and
a peripheral wire connected to the peripheral plug,
wherein top surfaces of the bit line and the peripheral wire are substantially coplanar with the top surface of the mold layer, and
wherein a bottom surface of the peripheral wire is lower than a bottom surface of the data storage element and is substantially coplanar with the top surface of the source line, and
wherein the bit line extends along one direction to be contact with a portion of the mold layer, and
wherein the bit line has a first thickness on the top surface of the data storage element and a second thickness greater than the first thickness on the portion of the mold layer.

6. The semiconductor device of claim 5, wherein the peripheral wire is formed of the same conductive material as the bit line.

7. The semiconductor device of claim 5, wherein a width of the bottom surface of the peripheral wire is smaller than a width of a top surface of the peripheral plug, and a width of a top surface of the peripheral wire is greater than the width of the bottom surface of the peripheral wire.

* * * * *